United States Patent
Steigerwald et al.

(10) Patent No.: US 6,479,404 B1
(45) Date of Patent: Nov. 12, 2002

(54) PROCESS FOR FABRICATING A SEMICONDUCTOR DEVICE HAVING A METAL OXIDE OR A METAL SILICATE GATE DIELECTRIC LAYER

(75) Inventors: Michael Steigerwald, Martinsville; Glen David Wilk, New Providence, both of NJ (US)

(73) Assignee: Agere Systems Inc., Allentown, PA (US)

( * ) Notice: Subject to any disclaimer, the term of this patent is extended or adjusted under 35 U.S.C. 154(b) by 43 days.

(21) Appl. No.: 09/641,160

(22) Filed: Aug. 17, 2000

(51) Int. Cl.[7] .................. H01L 21/31; H01L 21/469
(52) U.S. Cl. .................. 438/781; 438/780; 438/789
(58) Field of Search .................. 438/787, 789, 438/790, 781, 785

(56) References Cited

U.S. PATENT DOCUMENTS

| | | | |
|---|---|---|---|
| 5,552,337 A | * 9/1996 | Kwon et al. | 438/785 |
| 5,807,785 A | * 9/1998 | Ravi | 438/624 |
| 6,013,553 A | 1/2000 | Wallace et al. | 438/287 |
| 6,020,243 A | 2/2000 | Wallace et al. | 438/287 |
| 6,077,764 A | * 6/2000 | Sugiarto et al. | 438/597 |
| 6,306,722 B1 | * 10/2001 | Yang et al. | 438/424 |
| 6,313,035 B1 | * 11/2001 | Sanhu et al. | 438/681 |

OTHER PUBLICATIONS

Wilk et al., *Applied Physics Letters*, "Electrical Properties of Hafnium Silicate Gate Dielectric Deposited Directly on Silicon", vol. 74, No. 19. pp. 2854–2856, May 10, 1999.

Wilk et al., *Applied Physics Letters*, "Stable Zirconium Silicate Gate Dielectrics Deposited Directly on Silicon", vol. 76, No. 1. pp. 112–114, Jan. 3, 2000.

* cited by examiner

*Primary Examiner*—Caridad Everhart
(74) *Attorney, Agent, or Firm*—Richard J. Botos

(57) ABSTRACT

A process for forming a metal oxide or a metal silicate gate dielectric layer on a semiconductor substrate is disclosed. A suitably prepared substrate is placed in a chamber. An organic precursor gas is flowed into the chamber. An inorganic precursor gas is then flowed into the chamber. The organic precursor gas catalyzes a reaction between itself, the inorganic precursor and the substrate to form a dielectric layer on the substrate.

13 Claims, 1 Drawing Sheet

PROCESS FOR FABRICATING A SEMICONDUCTOR DEVICE HAVING A METAL OXIDE OR A METAL SILICATE GATE DIELECTRIC LAYER

BACKGROUND OF THE INVENTION

TECHNICAL FIELD

The invention relates to semiconductor devices and components and, specifically, to methods for forming gate dielectrics for semiconductor devices and components.

ART BACKGROUND

Dielectric materials are a key aspect to the performance of semiconductor devices. As devices become smaller, and the need for higher performance becomes greater, the thickness of the dielectric layers in semiconductor devices is decreasing. At the same time, the need for dielectric materials with a dielectric constant greater than that of the most common dielectric material, $SiO_2$, is increasing. Also, as the thickness of the dielectric layer in semiconductor devices decreases, the need for materials that do not leak charge even when the layer of the dielectric material is very thin (e.g. less than 100 Å) is increasing.

However, not all dielectric materials form acceptable, thin dielectric layers for use in semiconductor devices and components. Semiconductor devices have certain performance requirements such as efficiency, power of operation, etc. The properties of the layer of dielectric material directly effect device performance. For example, if the thin dielectric layer allows too much current to pass through it (this unwanted current is referred to as leakage current), then the resulting device or components will not meet the desired performance requirement. Since the leakage current through the gate dielectric of a MOSFET (metal-oxide-semiconductor-field-effect-transistor) indicates the insulation properties (resistance and reliability) of the dielectric, a gate dielectric layer through which the leakage current is too high indicates that the resistance and reliability of the dielectric layer is too low.

The interface state density between the dielectric layer and the underlying semiconductor interface also affects device performance. The interface state density degrades the current drive (current across the channel) and the reliability of MOSFETs and MIS(metal-insulator-semiconductor) FETs. Thus, if the interface state density is too high, then the resulting device or component will not meet the desired performance requirement.

Consequently dielectric materials that form thin dielectric layers with acceptable leakage characteristics and other properties are sought.

SUMMARY OF THE INVENTION

The present invention is directed to a process for fabricating a semiconductor device. In the process, a single crystal semiconductor substrate is provided. The substrate typically has structures such as device channel regions, and field oxide regions formed therein. The gate dielectric is then formed on the substrate. The gate dielectric is either a metal oxide, a metal silicate or both. A metal silicate material has the general structure $(MO_2)_x(SiO_2)_y$, wherein M is a metal, Si is silicon and O is oxygen. The relative mole fractions of these elements in the metal silicate are represented by x and y. Therefore, the sum of x and y is equal to 1. It is advantageous if the mole fraction of the metal oxide (x) is about 0.05 to about 0.8. It is advantageous if the mole fraction of the metal oxide is about 0.05 to about 0.5. The present invention contemplates metal oxides and metal silicates that contain one or more metals.

The dielectric materials of the present invention are advantageous because they are thermodynamically stable on silicon even when exposed to the high temperatures (i.e. over 800° C.) that are intrinsic to MOSFEIT fabrication. A stable material will maintain structural and chemical "integrity" because it does not react with the substrate. A structurally stable material does not undergo a phase change (e.g. from amorphous to polycrystalline) after formation. For example, $Ta_2O_5$ is not suitable because it reacts with silicon at 700° C. to form a tantalum-silicon-oxygen interface layer. Such an interface layer is undesirable because its thickness and composition are not controllable. In the process of the present invention, the undesirable interface layer is not formed, and the metal oxide or metal silicate formed on the substrate is stable.

The gate dielectric is formed on a prepared silicon substrate surface. The prepared surface has either a very thin (i.e. less than about 1.5 nm) oxide or silicon oxynitride layer formed thereon, is a hydrogen-terminated surface, or, advantageously, a clean silicon surface. The cleaned surfaces are formed using techniques well known to one skilled in the art.

The dielectric layer is formed on the prepared surface of the silicon substrate. The deposition conditions are selected to favor the formation of the metal silicate or metal oxide over the formation of silicon dioxide ($SiO_2$). Specifically, gaseous precursors that favor the formation of the metal silicate over silicon oxide are selected.

The gate dielectric layer is formed by chemical vapor deposition (CVD). In the CVD process, a first precursor (referred to as the inorganic precursor) is provided as the source for the metal component of the metal oxide or metal silicate. The first precursor has at least one metal-containing compound. If the dielectric layer is a metal silicate, the inorganic precursor has a silicon-containing compound in addition to a metal-containing compound. The silicon-containing compound is the source for silicon in the metal silicate. Thus, when the dielectric material is a metal silicate, it is contemplated that the first precursor is either one compound that is the source for both metal and silicon or two compounds (one being a metal source and the other being a silicon source). A second precursor (referred to as the organic precursor) is provided as the source for the oxygen in the dielectric layer.

The metal is any metal or combination of metals suited for forming a metal oxide or metal silicate dielectric layer. It is advantageous if the dielectric material has a dielectric constant of at least about 10. Examples of metals that form metal oxides and metal silicates with sufficiently high dielectric constants include zirconium, hafnium, lanthanum, yttrium, tantalum, aluminum, cerium and titanium. The metal-containing compound is selected to provide reaction kinetics that favor the formation of metal oxide or metal silicate on the silicon surface. Specifically, it is advantageous if the temperature at which the metal-containing compound decomposes is higher than the deposition temperature. Candidate metal compounds have decomposition temperatures at least above 200° C. It is advantageous if the precursors have a decomposition temperature above the deposition temperature so that the reaction by which the dielectric is formed is adequately controlled. Examples of suitable metal compounds include metal tetrachlorides (e.g. hafnium tetrachloride) and metal alkoxides (e.g. zirconium t-butoxide). For the metal alkoxides, it is advantageous if the alkyl moiety has no more than six carbon atoms to ensure that the metal alkoxide has a suitably high volatility.

The silicon containing compound, if present, is a silicon precursor such as tetraethyl orthosilicate (TEOS), silane or dichloro silane. Such precursors are well known to one skilled in the art and not discussed in detail herein. It is advantageous if the decomposition temperature of the silicon-containing compound is also above the deposition temperature.

As previously noted, the organic precursor is the source for oxygen. The organic precursor serves to catalyze a reaction with the inorganic precursor and with the surface of the silicon substrate to form the dielectric layer. However, the reaction does not favor the formation of $SiO_2$. Thus, the present invention affords an advantage over prior art processes where $SiO_2$ is formed along with the metal oxide or metal silicate. This is because, in prior art processes, oxygen species such as $O_2$ favor the formation of $SiO_2$. Examples of suitable organic precursors include alkyl oxides, alkyl phosphine oxides, alkyl sulfoxides and heterocyclic oxides. The alkyl moieties have 1–3 carbon atoms (e.g. methyl, ethyl and propyl groups). The heterocyclic oxides include oxanorbomene and oxanorbomadiene.

The organic precursor is also selected based on the range of temperatures over which it decomposes (i.e., its reaction temperature) and its ability to provide a byproduct that does not react with silicon. For example, dimethyl sulfoxide reacts with silicon and dimethylsulfide is the side-product of that reaction. Trimethylphosphine oxide reacts with silicon and trimethylphosphine is the side-product of that reaction. Oxanorbomadiene reacts with silicon and benzene is the side-product of that reaction. Oxanorbomene reacts with silicon and cyclohexadiene is the side-product. Ethylene oxide reacts with the silicon surface to form oxidized silicon and ethylene.

The temperature at which the metal or silicon is deposited defines the temperature range at which the organic precursor should decompose. Thus, an organic precursor with a decomposition temperature that is at or below the deposition temperature is selected.

The prepared substrate is then placed in a CVD tool for depositing the dielectric material. As previously noted, in order to ensure that a dielectric material with the desired composition and properties is obtained, it is advantageous if the wafer is heated to a temperature that is below the temperature at which the inorganic and organic precursors decompose. Although applicants do not wish to be held to a particular theory, applicant's believe that the desired reaction environment is found at a temperature below the decomposition temperature of the precursors. Above the decomposition temperature, there is a greater likelihood of side reactions that do not produce the desired dielectric material. It is advantageous if the wafer is heated to a temperature that is at least 50° C. below the lower decomposition temperature of the two precursors. It is particularly advantageous if the wafer is heated to a temperature that is at least 100° C. below the lower decomposition temperature of the two precursors. The temperature to which the wafer is heated thus depends upon the decomposition temperature (also referred to as the cracking temperature) of the two precursors.

The organic precursor is flowed into contact with the substrate. It is advantageous if the flow rate and partial pressure of the organic precursor is at least about five times the flow rate and partial pressure, respectively, of the inorganic precursor. As previously noted, the temperature of the substrate is below the decomposition temperature of the organic precursor. It is advantageous but not required for the organic precursor to be flowed into contact with the substrate first. The inorganic precursor is then flowed into contact with the substrate. The temperature and pressure are selected to ensure that the inorganic precursor molecules are contacting the substrate surface in the vapor phase but not depositing metal or oxygen thereon. In this regard, bare silicon surfaces are advantageous for trapping the inorganic precursors, followed by hydrogen-terminated silicon surfaces. It is also contemplated that the precursors will be pulsed in. That is, a pulse of organic precursor, followed by a pulse of inorganic precursor, following by a pulse of organic precursor, etc.

Under the selected conditions, the organic precursor catalyzes a reaction between the inorganic precursor molecules on the substrate. The selected conditions depend upon the decomposition temperature of the inorganic and organic precursors. In this regard, the deposition temperature is selected to facilitate the reaction between the two precursors to form the desired dielectric. The reaction continues until the desired dielectric thickness is obtained. The thickness of the dielectric film is monitored using conventional techniques for monitoring film thickness during the CVD process. When the desired thickness is obtained, the process is ceased by stopping the flow of the reactant gases into the chamber. The substrate is then allowed to cool and is then removed from the tool.

DETAILED DESCRIPTION

The present invention is directed to a process for fabricating a semiconductor device having a dielectric material. Specifically, the material has a dielectric constant greater than 4 (the dielectric constant of $SiO_2$ is about 4. It is advantageous if the dielectric constant is greater than 10. Examples of such devices include active devices such as field effect transistors (FEM and passive devices such as capacitors. In the process of the present invention, a metal oxide or metal silicate dielectric material is formed on a semiconductor substrate (e.g. silicon or silicon-germanium (SiGe)).

Figure 1:
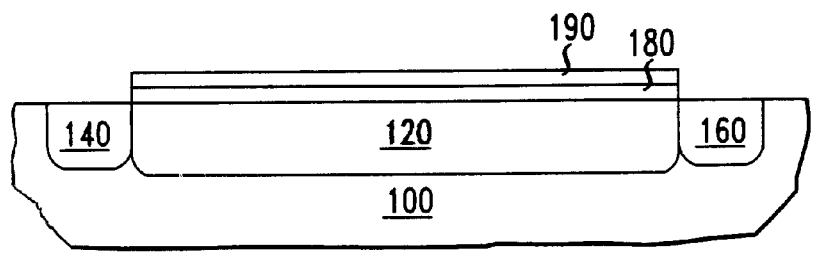
FIG. 1 is a cross-section of a field effect transistor.

The process of the present invention is illustrated in the context of fabricating a field effect transistor. With reference to FIG. 1, a simplified field effect transistor is shown in cross-section. In a field effect transistor a portion of the substrate (or epi-layer) 100 near the surface is designated as the channel 120 during processing. Channel 120 is electrically connected to source 140 and drain 160, such that when a voltage difference exists between source 140 and drain 160, current will tend to flow through channel 120. The semiconducting characteristics of channel 120 are altered such that its resistivity may be controlled by the voltage applied to gate 190, a conductive layer overlying channel 120. Thus by changing the voltage on gate 190, more or less current can be made to flow through channel 120. Gate 190 and channel 120 are separated by gate dielectric 180.

The gate dielectric 180 is insulating, such that between gate 190 and channel 120 little or no current flows during operation (although "tunneling" current is observed with thin dielectrics). However, the gate dielectric allows the gate voltage to induce an electric field in channel 120, giving rise to the name "field effect transistor". When the gate dielectric 180 is formed on the silicon substrate 100, the channel region 120 and field oxide regions (not shown) are already formed.

Figure 2:
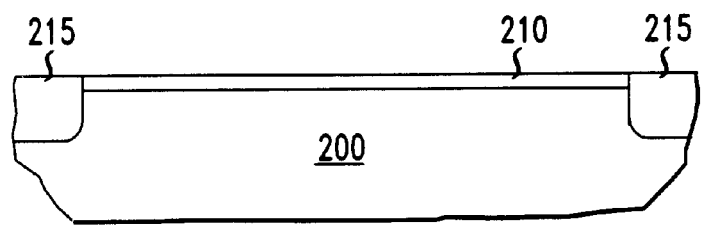
FIGS. 2–4 are cross-sectional views of a semiconductor device during fabrication.
Figure 3:
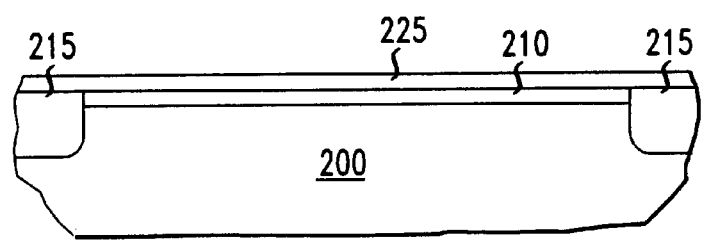

The process for forming the gate dielectric layer is described with reference to FIGS. 2–4. Referring to FIG. 2, there is provided a silicon substrate 200 with channel region 210 and field oxide regions 215 formed therein. The field oxide regions illustrated in FIG. 2 are formed by shallow trench isolation (STI). STI is a method that is well known to one skilled in the art and not discussed in detail herein. Any method for forming the field oxide regions 215 is compatible with the process of the present invention. It is advantageous if the substrate surface is prepared prior to the formation of the dielectric layer thereon. The substrate surface is prepared to remove impurities and native oxide from the surface, and to provide a high quality surface on which to form the dielectric layer. A variety of techniques for preparing a substrate surface for the formation of a dielectric layer thereon are well known to one skilled in the art and are not described in detail herein.

Depending upon the selected technique, the substrate surface has either a thin (e.g. less than 1.5 nm thick) silicon dioxide layer or silicon oxynitride layer formed thereon, a hydrogen terminated surface or a clean, non-oxidized silicon surface. Conventional expedients for forming an oxidized silicon layer on a silicon substrate include thermal oxidation, CVD or plasma assisted CVD. A hydrogen-terminated silicon surface is obtained by forming a layer of oxide followed by a brief (e.g. 20 second) etch using a dilute, aqueous solution of hydrofluoric acid (about one percent HF). For illustrative purposes, the surface of the substrate is prepared by forming a layer of oxide 225 (FIG. 3) on the surface thereof.

Figure 4:
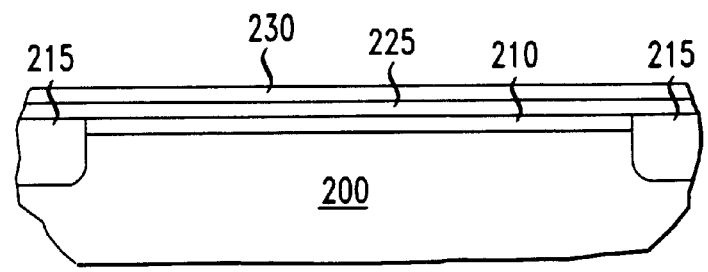

Referring to FIG. 4, dielectric layer 230 is either a metal oxide layer or a metal silicate layer. The dielectric layer is formed on the prepared surface of the silicon substrate. The gate dielectric layer is formed by CVD. In the CVD process, a first precursor (referred to as the inorganic precursor) is provided as the source for the metal component of the dielectric. The present invention contemplates that the inorganic precursors will contain one or more compounds, at least one of which is a metal compound. In the embodiments where the dielectric material is a metal silicate, the second compound is a silicon-containing compound. The number of inorganic precursors depends upon the dielectric material being formed. For example, if the dielectric material is zirconium silicate, then two inorganic precursor compounds, zirconium t-butoxide (the metal precursor) and tetraethyl orthosilicate (TEOS) (a silicon precursor), are used to form the dielectric material. A second precursor (referred to as the organic precursor) is provided as the source for the oxygen in the dielectric material.

The metal is any metal suited for forming a metal silicate or metal oxide dielectric layer. It is advantageous if the resulting dielectric material has a dielectric constant of at least about 10. Examples of metals that form dielectric materials with sufficiently high dielectric constants include zirconium, hafnium, lanthanum, yttrium, tantalum, aluminum, cerium and titanium. The metal-containing compound is selected to provide reaction kinetics that favor the formation of metal oxide or metal silicate on the silicon surface. Examples of suitable metal compounds include metal tetrachlorides (e.g. hafnium tetrachloride) and metal alkoxides (e.g. zirconium t-butoxide). For the metal alkoxides, it is advantageous if the alkyl moiety has no more than six carbon atoms to ensure that the metal alkoxide has a suitably high volatility.

The organic precursor serves to catalyze a reaction with the inorganic precursor and with the surface of the silicon substrate to form the dielectric layer. The organic precursor is the oxygen source for the formation of metal oxide or metal silicate. Although applicants do not wish to be held to a particular theory, applicants believe that the organic precursor facilitates the formation of the metal oxide or metal silicate without forming an interface layer of metal, silicon and oxygen. Such an interface layer is undesirable because the metal oxide or metal silicate layer formed on such an interface layer is unstable. Furthermore, it is difficult to control the composition and thickness of such a layer. Examples of suitable organic oxides include alkyl oxides, alkyl phosphine oxides, alkyl sulfoxides and heterocyclic oxides. The alkyl moieties have 1–3 carbon atoms (e.g. methyl, ethyl and propyl groups). The heterocyclic oxides include oxanorbornene and oxanorbornadiene.

The prepared substrate is then placed in a CVD tool for depositing the dielectric material. As previously noted, it is advantageous if the wafer is heated to a temperature that is below the temperature at which the inorganic and organic precursors decompose and above the temperature at which the precursors will condense on the substrate. It is advantageous if the wafer is heated to a temperature that is at least 50° C. below the lower decomposition temperature of the two precursors. It is particularly advantageous if the wafer is heated to a temperature that is at least 100° C. below the lower decomposition temperature of the two precursors. The temperature to which the wafer is heated thus depends upon the decomposition temperature (also referred to as the cracking temperature) of the two precursors. The deposition temperature, although preferably lower than the decomposition temperature of the individual precursors, is selected to facilitate the reaction that forms the desired dielectric material. Although applicants do not wish to be held to a particular, applicant's believe that the proximity of the precursor cracking temperature to each other, in addition to the proximity of the cracking temperature to the deposition temperature is an indication of whether the desired reaction is likely to occur.

For example, oxanorbornene has a cracking temperature of about 350° C. to about 400° C. When oxanorbornene is used, an inorganic precursor that cracks at a temperature of about 350° C. to about 400° C. is also selected. The wafer is heated up to a temperature of 300° C. (i.e. 50° C. below the lowest cracking temperature). Under these conditions, the desired dielectric is likely to be obtained.

Oxanorbornadiene cracks at a temperature of about 250° C. to about 300° C. When oxanorbornadiene is used, an inorganic precursor that cracks at a temperature of about 250° C. to about 300° C. is also selected. The wafer is heated up to a temperature of 200° C. Under these conditions, the desired dielectric is likely to be obtained.

Alkyl sulfoxides crack at temperatures of about 150° C to about 200° C. Therefore, when an alkyl sulfoxide organic precursor is used, an inorganic precursor that cracks at a temperature of about 150° C. to about 200° C. is also selected. The wafer is heated to a temperature of about 100° C. Under these conditions, the desired dielectric is likely to be obtained.

Phosphine oxides crack at temperatures of about 250° C. to about 300° C. Therefore, the phosphine oxide is combined with inorganic precursors that crack at a temperature of about 250° C. to about 300° C. The wafer is heated to about 200° C. Under these conditions the desired dielectric material is likely to be obtained.

It is advantageous, but not required, if the organic precursor is flowed into contact with the substrate first. The partial pressure of the organic precursor generally is in the range of about 1 mTorr to about 100 mTorr. It is advantageous if the flow rate and partial pressure of the organic precursor is in the range of about five to about ten times greater than the flow rate and partial pressure, respectively, of the inorganic precursor.

The inorganic precursor is then flowed into contact with the substrate. It is contemplated that one or more than one inorganic precursor will be used. The number of inorganic precursors depends upon the material being deposited. More than one inorganic precursor is typically required to deposit a metal silicate (e.g. one for the metal and one for silicon). The temperature and pressure are selected to ensure that the inorganic precursor molecules are contacting the substrate surface in the vapor phase but not depositing metal or oxygen thereon. In this regard, bare silicon surfaces are advantageous for trapping the inorganic precursors, followed by hydrogen-terminated silicon surfaces. Although the partial pressure of the inorganic precursor near the substrate is largely a matter of design choice, partial pressures in the range of about 1 mTorr to about 20 mTorr are contemplated as suitable.

It is also contemplated that the precursors will be pulsed in. That is, a pulse of organic precursor, followed by a pulse of inorganic precursor, etc.

It is advantageous if a reducing gas such as hydrogen or a mixture of hydrogen and nitrogen accompanies the flow of the inorganic precursor. The reducing gas is provided to reduce the number of reactions that would otherwise occur between the substrate surface and any oxygen left in the atmosphere near the substrate.

Under the prescribed conditions, the organic precursor catalyzes a reaction between the inorganic precursor molecules on the substrate. Specifically, under the conditions of the process of the present invention, the organic precursor permits approximately a monolayer of oxygen to form on the silicon surface. The reaction continues until the desired dielectric thickness is obtained. The thickness of the dielectric film is monitored using conventional techniques for monitoring film thickness during a CVD process. When the desired thickness is obtained, the process is ceased. Stopping the flow of the reactant gases into the chamber stops the process. The substrate is allowed to cool to ambient temperature and then removed from the tool.

After the dielectric layer is formed, the fabrication of the device is completed using conventional processes and expedients well known to one skilled in the art. Consequently, forming the remaining components of the device (e.g. the source, drain and gate) is not discussed herein.

For purposes of illustration, the dielectric material formed on the substrate is zirconium oxide ($ZrO_2$) and zirconium silicate ($ZrSiO_4$). The inorganic precursor that is the source of zirconium is zirconium t-butoxide ($Zr(OC_4H_9)_4$). The inorganic precursor that is the source of silicon is TEOS. A silicon substrate, suitably prepared, is placed in a chamber of a CVD tool. The cracking temperature of zirconium t-butoxide is 400° C. The cracking temperature of TEOS is 500° C. The temperature of the substrate is stabilized at 300° C.

Oxanorbornadiene ($C_6H_6O$) is introduced into the chamber at a partial pressure of 50 mTorr. TEOS and zirconium t-butoxide were then flowed into the chamber. The partial pressure of the zirconium t-butoxide and the zirconium oxide in the chamber is 10 mTorr. The oxanorbornadiene catalyzes a reaction between itself and the inorganic precursors to deposit the zirconium oxide/zirconium silicate film on the surface of the semiconductor substrate without forming an additional $SiO_2$ layer. As the film is formed, the reaction byproducts (t-butoxide and benzene) are pumped out of the chamber.

The present invention is described in terms of certain embodiments and examples. These embodiments and examples are provided to further describe the invention. One skilled in the art will appreciate that modifications to the embodiments and examples provided herein are possible without departing from the spirit and scope of the invention, which is defined in the appended claims.

What is claimed is:

1. A process for device fabrication comprising:
   providing a semiconductor substrate;
   forming a dielectric layer on the semiconductor substrate by placing the substrate in a chamber; introducing an organic precursor gas and an inorganic precursor gas into the chamber wherein the organic precursor is an oxygen-containing organic compound that does not favor a reaction with the substrate to form an oxidized semiconductor compound and the organic precursor gas catalyzes a reaction between the inorganic precursor gas, the organic precursor gas and the substrate to form a dielectric layer thereon.

2. The process of claim 1 wherein the inorganic precursor comprises a metal-containing compound.

3. The process of claim 2 wherein the inorganic precursor further comprises a silicon-containing compound.

4. The process of claim 1 wherein the organic precursors are selected from the group consisting of alkyl oxides, alkyl phosphine oxides, alkyl sulfoxides and hetrocyclic oxides wherein the alkyl group has 1 to 3 carbon atoms.

5. The process of claim 1 wherein the organic precursor is a heterocyclic oxide selected from the group consisting of oxanorbornene and oxanorbornadiene.

6. The process of claim 1 further comprising heating the substrate to a temperature that is less than the decomposition temperature of the inorganic precursor and the organic precursor.

7. The process of claim 3 wherein the dielectric layer comprises a metal silicate.

8. The process of claim 7 wherein the dielectric layer has the general structure $(MO_2)x(SiO_2)_y$ wherein M is at least one metal, Si is silicon and O is oxygen, x is about 0.05 to about 0.8 and y is about 0.95 to about 0.2 and the sum of x and y is 1.

9. The process of claim 8 wherein x is about 0.05 to about 0.5 and y is about 0.95 to about 0.5.

10. The process of claim 1 wherein the dielectric layer has a dielectric constant greater than 4.

11. The process of claim 1 wherein the dielectric layer has a dielectric constant greater than 10.

12. The process of claim 1 further comprising cleaning the semiconductor substrate before forming the dielectric layer on the semiconductor substrate.

13. The process of claim 1 wherein the dielectric layer is formed on the substrate using chemical vapor deposition.

* * * * *